United States Patent
Oshima et al.

(10) Patent No.: US 7,312,957 B2
(45) Date of Patent: Dec. 25, 2007

(54) CURRENT-PERPENDICULAR-TO-THE-PLANE STRUCTURE MAGNETORESISTIVE ELEMENT HAVING SUFFICIENT SENSITIVITY

(75) Inventors: Hirotaka Oshima, Kawasaki (JP);
Yutaka Shimizu, Kawasaki (JP);
Atsushi Tanaka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 333 days.

(21) Appl. No.: 10/940,941

(22) Filed: Sep. 14, 2004

(65) Prior Publication Data

US 2005/0030673 A1  Feb. 10, 2005

Related U.S. Application Data

(63) Continuation of application No. PCT/JP02/02684, filed on Mar. 20, 2002.

(51) Int. Cl.
G11B 5/33 (2006.01)
G11B 5/127 (2006.01)

(52) U.S. Cl. .................................................. 360/322

(58) Field of Classification Search .............. 360/320, 360/322; 29/603.07
See application file for complete search history.

(56) References Cited

U.S. PATENT DOCUMENTS

| | | | |
|---|---|---|---|
| 5,390,061 A | 2/1995 | Nakatani et al. | 360/113 |
| 5,726,837 A | 3/1998 | Nakatani et al. | 360/113 |
| 5,731,937 A | 3/1998 | Yuan | |
| 5,761,010 A * | 6/1998 | Mimura | 360/327.32 |
| 6,011,674 A | 1/2000 | Nakatani et al. | 360/113 |
| 6,198,609 B1 | 3/2001 | Barr et al. | 360/322 |
| 6,278,593 B1 | 8/2001 | Nakatani et al. | 360/324.2 |
| 6,325,900 B1 | 12/2001 | Komuro et al. | 204/192.2 |

(Continued)

FOREIGN PATENT DOCUMENTS

EP  0 953 849 A  11/1999

(Continued)

OTHER PUBLICATIONS

Kumar et al. "Grain size dependence of electrical resistivity of tin and lead films" Database Compendex [Online] Engineering Information, Inc., New York, NY, US; (Sep. 1990), XP002427018.

*Primary Examiner*—Angel Castro
*Assistant Examiner*—Christopher R. Magee
(74) *Attorney, Agent, or Firm*—Greer, Burns & Crain, Ltd.

(57) ABSTRACT

A current-perpendicular-to-the-plane (CPP) structure magnetoresistive element includes an electrode layer contacting a magnetoresistive film. A low resistance region is defined to extend rearward along the boundary of the magnetoresistive film from the front end exposed at the medium-opposed surface of the head slider. A high resistance region is defined to extend rearward along the boundary from the rear end of the low resistance region. The high resistance region has a resistivity higher than that of the low resistance region. The high resistance region serves to restrict the path of a sensing current nearest to the medium-opposed surface. The sensing current is allowed to concentrate at a position closest to the medium-opposed surface in the magnetoresistive film. Magnetization sufficiently rotates in the magnetoresistive film near the medium-opposed surface. The CPP structure magnetoresistive element maintains a sufficient variation in the resistance. A sufficient sensitivity can be maintained.

10 Claims, 5 Drawing Sheets

U.S. PATENT DOCUMENTS

| | | |
|---|---|---|
| 6,327,107 B1 | 12/2001 | Komuro et al. ............... 360/55 |
| 6,333,842 B1 | 12/2001 | Nobuyuki et al. ........ 360/324.2 |
| 6,483,677 B2 | 11/2002 | Nakatani et al. ......... 360/324.2 |
| 6,504,690 B2 | 1/2003 | Komuro et al. .......... 360/324.2 |
| 6,587,318 B2 | 7/2003 | Komuro et al. .......... 360/324.2 |
| 6,639,766 B2 | 10/2003 | Nobuyuki et al. ........ 360/324.2 |
| 6,654,209 B2 * | 11/2003 | Seigler et al. .............. 360/322 |
| 6,687,099 B2 | 2/2004 | Nakatani et al. ......... 360/324.2 |
| 6,738,234 B1 | 5/2004 | Araki et al. ................ 360/324 |
| 6,757,143 B2 * | 6/2004 | Tunayama et al. ....... 360/324.1 |
| 7,035,057 B2 | 4/2006 | Shimazawa et al. ........ 360/320 |
| 7,054,120 B2 | 5/2006 | Nakatani et al. ......... 360/324.2 |
| 7,159,303 B2 | 1/2007 | Nakatani et al. ......... 29/603.13 |
| 2001/0015877 A1 | 8/2001 | Seyama et al. ............. 360/322 |
| 2006/0272146 A1 | 12/2006 | Seyama et al. ........... 29/603.01 |

FOREIGN PATENT DOCUMENTS

| | | |
|---|---|---|
| JP | 7-296340 | 11/1995 |
| JP | 07296340 A * | 11/1995 |
| JP | 10-55512 | 2/1998 |
| JP | 2002-025018 | 1/2001 |
| JP | 2001-283414 | 10/2001 |

* cited by examiner

CURRENT-PERPENDICULAR-TO-THE-PLANE STRUCTURE MAGNETORESISTIVE ELEMENT HAVING SUFFICIENT SENSITIVITY

This is a continuation of International PCT Application No. PCT/JP02/02684 filed Mar. 20, 2002.

BACKGROUND OF THE INVENTION

1. Field of the Invention

The present invention relates to a magnetoresistive utilizing a magnetoresistive film such as a tunnel-junction film, a spin valve film, or the like. In particular, the invention relates to a current-perpendicular-to-the-plane (CPP) structure magnetoresistive element allowing a sensing current to flow through a magnetoresistive film, overlaid on a datum plane, in a direction perpendicular to the datum plane.

2. Description of the Prior Art

A magnetoresistive film such as a spin valve film is well known. The spin valve film is layered on a predetermined datum plane. The magnetoresistive film is interposed between upper and lower electrodes in a CPP structure magnetoresistive element. A sensing current is allowed to flow between the upper and lower electrodes in the direction perpendicular to the datum plane.

The CPP structure magnetoresistive element is usually mounted on a head slider including a medium-opposed surface opposed to a magnetic recording medium, for example. The magnetoresistive film extends along an imaginary plane perpendicularly intersecting the medium-opposed surface in the head slider. When a magnetic field is applied to the magnetoresistive film from the magnetic recording medium, the magnetization rotates in the magnetoresistive film.

If the recording density will further be improved in the magnetic recording medium, the magnetic field from the magnetic recording medium is expected to get reduced. A magnetic field of a smaller intensity reduces the rotation of the magnetization in the magnetoresistive film at a position remoter from the medium-opposed surface. A reduced amount of the rotation in this manner induces a less sensitivity of the magnetoresistive element.

SUMMARY OF THE INVENTION

It is accordingly an object of the present invention to provide a current-perpendicular-to-the-plane (CPP) structure magnetoresistive element capable of maintaining a sufficient sensitivity to a magnetic field leaked out of a magnetic recording medium.

According to a first aspect of the present invention, there is provided a current-perpendicular-to-the-plane (CPP) structure magnetoresistive element comprising: a magnetoresistive film defining the front end at a medium-opposed surface of a head slider, the magnetoresistive film extending rearward from the front end along a predetermined datum plane intersecting the medium-opposed surface of the head slider; and an electrode layer extending rearward along the boundary of the magnetoresistive film from the front end exposed at the medium-opposed surface of the head slider, wherein the electrode layer includes: a low resistance region extending rearward along the boundary from the front end exposed at the medium-opposed surface of the head slider; and a high resistance region extending rearward along the boundary from the rear end of the low resistance region, the high resistance region having a resistivity higher than that of the low resistance region.

The high resistance region serves to restrict the path of a sensing current nearest to the medium-opposed surface of the head slider in the magnetoresistive film in the CPP structure magnetoresistive element. The sensing current is thus allowed to concentrate at a position closest to the medium-opposed surface in the magnetoresistive film. Since magnetization tends to sufficiently rotate in the magnetoresistive film near the medium-opposed surface, the CPP structure magnetoresistive element in this manner maintains a sufficient variation in the electric resistance. A reduced sensitivity can be prevented in the CPP structure magnetoresistive element.

According to a second aspect of the present invention, there is provided a current-perpendicular-to-the-plane (CPP) structure magnetoresistive element comprising: a magnetoresistive film defining the front end at a medium-opposed surface of a head slider, the magnetoresistive film extending rearward from the front end along a predetermined datum plane intersecting the medium-opposed surface of the head slider; an upper electrode layer extending rearward along the upper boundary of the magnetoresistive film from the front end exposed at the medium-opposed surface of the head slider; a lower electrode allowing at least the tip end to contact the lower boundary of the magnetoresistive film, the tip end exposed at the medium-opposed surface of the head slider, wherein the upper electrode layer includes: a low resistance region extending rearward along the upper boundary from a front end exposed at the medium-opposed surface of the head slider; and a high resistance region extending rearward along the upper boundary from the rear end of the low resistance region, the high resistance region having a resistivity higher than that of the low resistance region.

A sensing current is exchanged between the low resistance region of the upper electrode layer and the lower electrode in the CPP structure magnetoresistive element. The high resistance region serves to restrict the path of the sensing current nearest to the medium-opposed surface of the head slider in the magnetoresistive film in the CPP structure magnetoresistive element. The sensing current is thus allowed to concentrate at a position closest to the medium-opposed surface in the magnetoresistive film. Since magnetization tends to sufficiently rotate in the magnetoresistive film near the medium-opposed surface, the CPP structure magnetoresistive element in this manner maintains a sufficient variation in the electric resistance. A reduced sensitivity can be prevented in the CPP structure magnetoresistive element.

The high resistance region may be formed based on oxygen atoms added into the electrode layer or the upper electrode layer in the CPP structure magnetoresistive element. The oxygen atoms may form oxides having a resistivity higher than that of metals. Introduction of oxygen gas, irradiation of oxygen plasma, or the like, may be utilized to add the oxygen atoms into the electrode layer or the upper electrode layer in the process of forming the electrode layer or the upper electrode layer.

Alternatively, the high resistance region may be formed based on ions doped into the electrode layer or the upper electrode layer in the CPP structure magnetoresistive elements. Local introduction of impurities, defect in metallic crystals, or the like serves to realize a resistivity higher than that of pure metals. The pure metals in this case may include an alloy, for example. Ion implantation or the like may be utilized to dope the ions into the electrode layer or the upper electrode layer in the process of forming the electrode layer or the upper electrode layer.

Otherwise, the low and high resistance regions may be defined in the electrode layer or the upper electrode layer based on the size of crystal grains. In this case, the low resistance region may include crystal grains having a grain size larger than that of crystal grains in the high resistance region. The material of the high resistance region may be identical to that of the low resistance region. The smaller the size of grains gets, the higher the electric resistance gets. For example, irradiation of a laser beam on crystal grains helps crystal grains grow larger in size.

In addition, the low and high resistance regions may be defined in the electrode layer or the upper electrode layer based on the thickness in the electrode layer or the upper electrode layer. In this case, the electrode layer or the upper electrode layer may include: a first region extending along the boundary so as to form the lower resistance region, the first region having a first thickness; and a second region extending along the boundary so as to form the high resistance region, the second region having a second thickness smaller than the first thickness.

According to a third aspect of the present invention, there is provided a current-perpendicular-to-the-plane (CPP) structure magnetoresistive element comprising: a magnetoresistive film defining the front end at a medium-opposed surface of a head slider, the magnetoresistive film extending rearward from the front end along a predetermined datum plane intersecting the medium-opposed surface of the head slider; an electrode allowing the tip end to contact the boundary of the magnetoresistive film, the tip end exposed at the medium-opposed surface; and a high resistance layer extending rearward along the boundary from the tip end retreating from the medium-opposed surface, the high resistance layer having a resistivity higher than that of the electrode.

The high resistance layer serves to shift the contact of the electrode on the boundary of the magnetoresistive film toward the medium-opposed surface of the head slider in the CPP structure magnetoresistive element. A sensing current is thus allowed to concentrate at a position closest to the medium-opposed surface in the magnetoresistive film. Since magnetization tends to sufficiently rotate in the magnetoresistive film near the medium-opposed surface, the CPP structure magnetoresistive element in this manner maintains a sufficient variation in the electric resistance. A reduced sensitivity can be prevented in the CPP structure magnetoresistive element.

According to a fourth aspect of the present invention, there is provided a current-perpendicular-to-the-plane (CPP) structure magnetoresistive element comprising: a magnetoresistive film defining the front end at a medium-opposed surface of a head slider, the magnetoresistive film extending rearward from the front end along a predetermined datum plane intersecting the medium-opposed surface of the head slider; an upper electrode allowing the tip end to contact the upper boundary of the magnetoresistive element, the tip end exposed at the medium-opposed surface of the head slider; a high resistance layer extending rearward along the upper boundary from the tip end retreating from the medium-opposed surface, the high resistance layer having a resistivity higher than that of the upper electrode; and a lower electrode allowing at least the tip end to contact the lower boundary of the magnetoresistive film, the tip end exposed at the medium-opposed surface of the head slider.

A sensing current is exchanged between the upper and lower electrode through the magnetoresistive film in the CPP structure magnetoresistive element. The high resistance layer serves to shift the contact of the upper electrode on the boundary of the magnetoresistive film toward the medium-opposed surface of the head slider in the CPP structure magnetoresistive element. The sensing current is thus allowed to concentrate at a position closest to the medium-opposed surface in the magnetoresistive film. Since magnetization tends to sufficiently rotate in the magnetoresistive film near the medium-opposed surface, the CPP structure magnetoresistive element in this manner maintains a sufficient variation in the electric resistance. A reduced sensitivity can be prevented in the CPP structure magnetoresistive element.

The CPP structure magnetoresistive elements may be mounted on a head slider usually incorporated within a magnetic disk drive such as a hard disk drive (HDD), for example. Alternatively, the CPP structure magnetoresistive elements may be mounted on a head slider incorporated within a magnetic medium drive such as a magnetic tape drive and the like.

BRIEF DESCRIPTION OF THE DRAWINGS

The above and other objects, features and advantages of the present invention will become apparent from the following description of the preferred embodiments in conjunction with the accompanying drawings, wherein.

DESCRIPTION OF THE PREFERRED EMBODIMENTS

Figure 1:
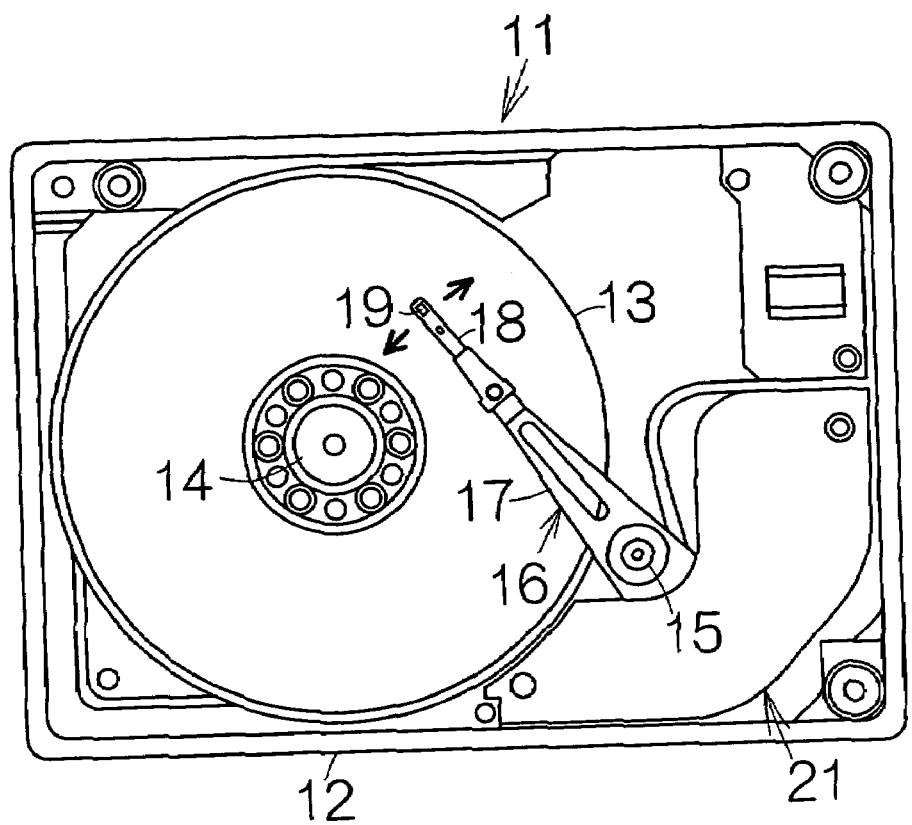
FIG. 1 is a plan view schematically illustrating the inner structure of a hard disk drive (HDD)

FIG. 1 schematically illustrates the interior structure of a hard disk drive (HDD) 11 as an example of a magnetic recording medium drive or storage device. The HDD 11 includes a box-shaped main enclosure 12 defining an inner space of a flat parallelepiped, for example. At least one magnetic recording disk 13 is incorporated in the inner space within the main enclosure 12. The magnetic recording disk 13 is mounted on the driving shaft of a spindle motor 14. The spindle motor 14 is allowed to drive the magnetic recording disk 13 for rotation at a higher revolution rate such as 7,200 rpm, 10,000 rpm, or the like, for example. A cover, not shown, is coupled to the main enclosure 12 so as to define the closed inner space between the main enclosure 12 and itself.

A carriage 16 is also incorporated in the inner space of the main enclosure 12 for swinging movement about a vertical support shaft 15. The carriage 16 includes a rigid swinging arm 17 extending in the horizontal direction from the vertical support shaft 15, and an elastic head suspension 18 fixed to the tip end of the swinging arm 17 so as to extend forward from the swinging arm 17. As conventionally known, a flying head slider 19 is cantilevered at the tip end of the head suspension 18 through a gimbal spring, not shown. The head suspension 18 serves to urge the flying head slider 19 toward the surface of the magnetic recording disk 13. When the magnetic recording disk 13 rotates, the flying head slider 19 is allowed to receive airflow generated along the rotating magnetic recording disk 13. The airflow serves to generate a lift on the flying head slider 19. The flying head slider 19 is thus allowed to keep flying above the surface of the magnetic recording disk 13 during the rotation of the magnetic recording disk 13 at a higher stability established by the balance between the lift and the urging force of the head suspension 18.

When the carriage 16 is driven to swing about the support shaft 15 during the flight of the flying head slider 19, the flying head slider 19 is allowed to cross the recording tracks defined on the magnetic recording disk 13 in the radial direction of the magnetic recording disk 13. This radial movement serves to position the flying head slider 19 right above a target recording track on the magnetic recording disk 13. In this case, an actuator 21 such as a voice coil motor (VCM) can be employed to realize the swinging movement of the carriage 16, for example. As conventionally known, in the case where two or more magnetic recording disks 13 are incorporated within the inner space of the main enclosure 12, a pair of the elastic head suspension 18 is disposed between the adjacent magnetic recording disks 13.

Figure 2:
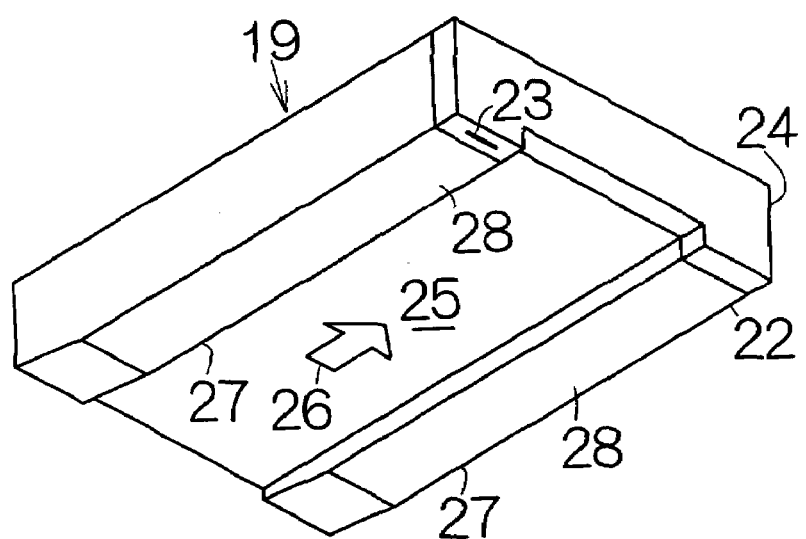
FIG. 2 is an enlarged perspective view schematically illustrating a flying head slider according to a specific example.

FIG. 2 illustrates a specific example of the flying head slider 19. The flying head slider 19 of this type includes a slider body 22 made of $Al_2O_3$—TiC in the form of a flat parallelepiped, and a head protection layer 24 formed to spread over the trailing or outflow end of the slider body 22. The head protection layer 24 may be made of $Al_2O_3$ (alumina). A read/write electromagnetic transducer 23 is embedded in the head protection layer 24. A medium-opposed surface or bottom surface 25 is defined continuously over the slider body 22 and the head protection layer 24 so as to face the surface of the magnetic recording disk 13 at a distance. The bottom surface 25 is designed to receive airflow 26 generated along the surface of the rotating magnetic recording disk 13.

A pair of rail 27 is formed to extend over the bottom surface 25 from the leading or inflow end toward the trailing or outflow end. The individual rail 27 is designed to define an air bearing surface (ABS) 28 at its top surface. The airflow 26 generates the aforementioned lift at the respective air bearing surfaces 28. The read/write electromagnetic transducer 23 embedded in the head protection layer 24 is exposed at the air bearing surface 28 as described later in detail. In this case, a diamond-like-carbon (DLC) protection layer may be formed over the air bearing surface 28 so as to cover over the exposed end of the read/write electromagnetic transducer 23. The flying head slider 19 may take any shape or form other than the above-described one.

Figure 3:
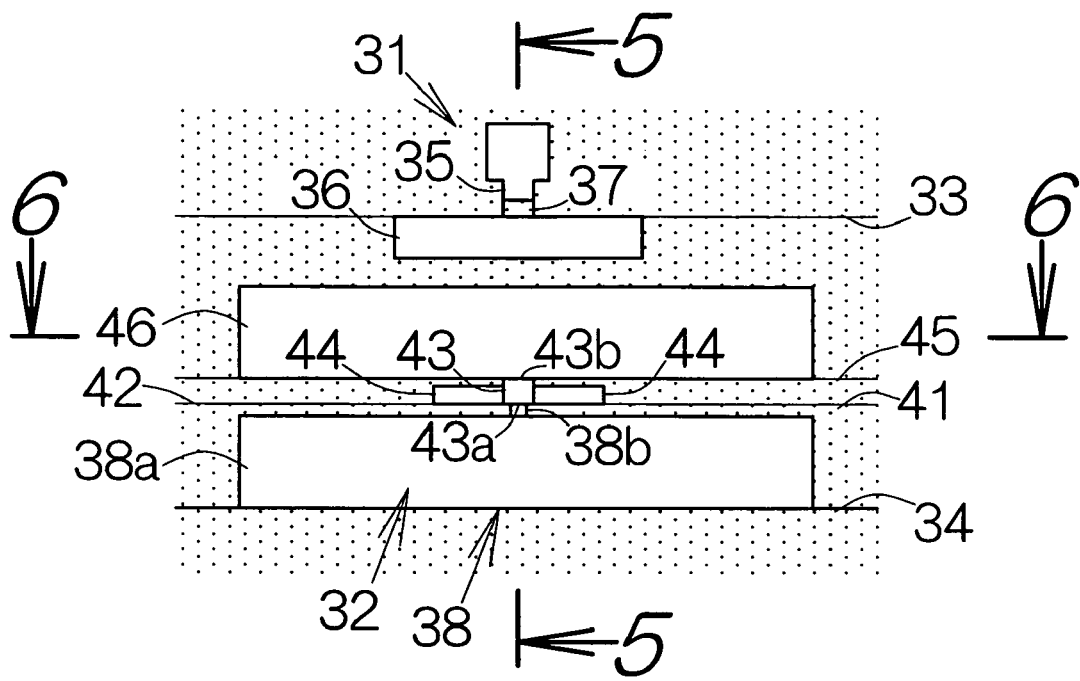
FIG. 3 is a front view schematically illustrating a read/write electromagnetic transducer observed at an air bearing surface of the flying head slider.

FIG. 3 illustrates an enlarged detailed view of the read/write electromagnetic transducer 23 exposed at the air bearing surface 28. The read/write electromagnetic transducer 23 includes an inductive write element or a thin film magnetic head 31 and a current-perpendicular-to-the-plane (CPP) structure electromagnetic transducer element or CPP structure magnetoresistive (MR) read element 32. The thin film magnetic head 31 is designed to write a magnetic bit data onto the magnetic recording disk 13 by utilizing a magnetic field induced in a conductive swirly coil pattern, not shown, for example. The CPP structure MR read element 32 is designed to discriminate a magnetic bit data by utilizing variation in the electric resistance in response to the inversion of the magnetic polarity in a magnetic field acting from the magnetic recording disk 13. The thin film magnetic head 31 and the CPP structure MR read element 32 are interposed between an $Al_2O_3$ (alumina) layer 33 as an upper half layer or overcoat film and an $Al_2O_3$ (alumina) layer 34 as a lower half layer or undercoat film. The overcoat and undercoat films in combination establish the aforementioned head protection layer 24.

The thin film magnetic head 31 includes an upper magnetic pole layer 35 exposing the front end at the air bearing surface 28, and a lower magnetic pole layer 36 likewise exposing the front end at the air bearing surface 28. The upper and lower magnetic pole layers 35, 36 may be made of FeN, NiFe, or the like, for example. The combination of the upper and lower magnetic pole layers 35, 36 establishes the magnetic core of the thin film magnetic head 31.

A non-magnetic gap layer 37 is interposed between the upper and lower magnetic pole layers 35, 36. The non-magnetic gap layer 37 may be made of $Al_2O_3$ (alumina), for example. When a magnetic field is induced at the conductive swirly coil pattern, a magnetic flux is exchanged between the upper and lower magnetic pole layers 35, 36. The non-magnetic gap layer 37 allows the exchanged magnetic flux to leak out of the air bearing surface 28. The thus leaked magnetic flux forms a magnetic field for recordation, namely, a write gap magnetic field.

The CPP structure MR read element 32 includes a lower electrode 38 spreading over the upper surface of the alumina layer 34 as a basement insulation layer. The lower electrode 38 is designed to comprise an electrically-conductive lead layer 38a and an electrically-conductive terminal piece 38b standing on the upper surface of the lead layer 38a. The lower electrode 38 may have not only a property of electric conductors but also a soft magnetic property. If the lower electrode 38 is made of a soft magnetic electric conductor, such as NiFe, for example, the lower electrode 38 is also allowed to serve as a lower shielding layer for the CPP structure MR read element 32.

The lower electrode 38 is embedded in an insulation layer 41 spreading over the surface of the alumina layer 34. The insulation layer 41 is designed to extend over the surface of the lead layer 38a so as to contact the side surface of the terminal piece 38b. Here, the combination of the terminal piece 38b and the insulation layer 41 represents a predetermined substructure layer. A flat surface 42 or datum plane can be defined continuously on the substructure layer over the top surface of the terminal piece 38b and the upper surface of the insulation layer 41.

An electromagnetic transducer film or magnetoresistive (MR) film 43 is located on the flat surface 42 so as to extend along the air bearing surface 28. The magnetoresistive film 43 extends rearward, over the flat surface 42, from the front end exposed at the air bearing surface 28. The magnetoresistive film 43 is designed to extend at least across the top surface of the terminal piece 38b. The terminal piece 38b is allowed to contact the bottom or lower boundary 43a of the magnetoresistive film 43 at least at the front end exposed at the air bearing surface 28. In this manner, electric connection can be established between the magnetoresistive film 43 and the lower electrode 38. The structure of the magnetoresistive film 43 will be described later in detail.

A pair of magnetic domain control layer 44 is also located on the flat surface 42 so as to extend along the air bearing surface 28. The magnetoresistive film 43 is interposed between the magnetic domain control layers 44 on the flat surface 42 along the air bearing surface 28. A metallic material such as CoPt, CoCrPt, or the like, may be utilized to form the magnetic domain control layers 44, for example. A magnetization is established in the magnetic domain control layers 44 in a direction across the magnetoresistive film 43 in a conventional manner. The magnetization of the magnetic domain control layers 44 serves to form a biasing magnetic field. The biasing magnetic field realizes a single domain property in a free magnetic layer in the magnetoresistive film 43.

The flat surface 42 is covered with an overlaid insulation layer 45. The magnetic domain control layers 44 are interposed between the overlaid insulation layer 45 and the insulation layer 41. The top surface or upper boundary of the magnetoresistive film 43 is exposed in the overlaid insulation layer 45 near the air bearing surface 28.

An upper electrode layer 46 extends over the overlaid insulation layer 45. The upper electrode layer 46 is designed to allow at least the tip end to contact the upper boundary 43b of the magnetoresistive film 43. The tip end of the upper electrode layer 46 get exposed at the air bearing surface 28. Electric connection can in this manner be established between the magnetoresistive film 43 and the upper electrode layer 46. The upper electrode layer 46 will be described later in detail.

Figure 4:
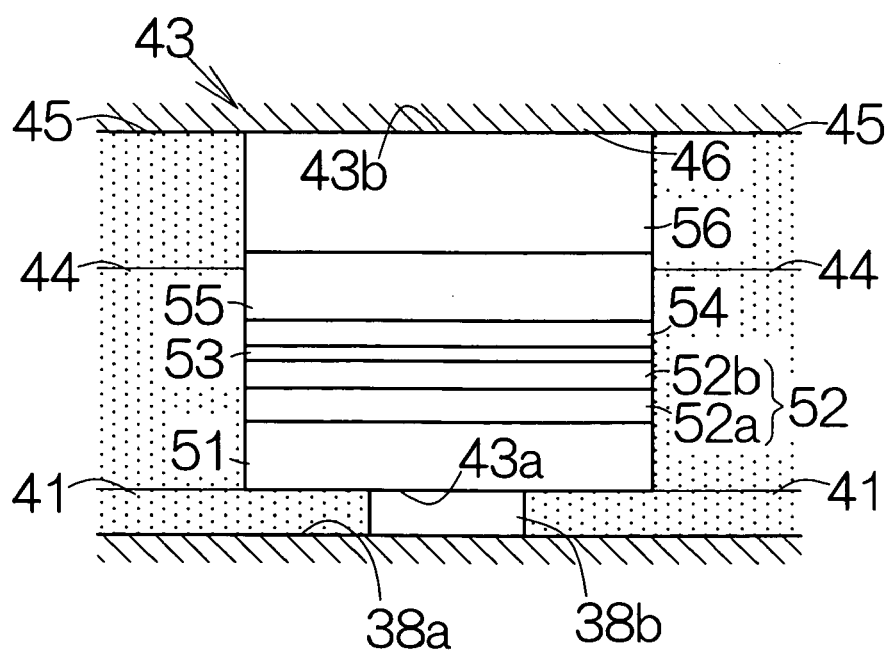
FIG. 4 is an enlarged front view schematically illustrating the structure of a magnetoresistive (MR) film according to a specific example.

FIG. 4 illustrates a specific example of the magnetoresistive film 43. The magnetoresistive film 43 is a so-called spin valve film. Specifically, the magnetoresistive film 43 includes a basement layer 51 made of Ta, a free ferromagnetic layer 52, an intermediate conductive layer 53, a pinned ferromagnetic layer 54, a pinning layer or antiferromagnetic layer 55 and a conductive protection layer 56 spreading over the flat surface 42 in this sequence. The magnetization of the pinned ferromagnetic layer 54 is fixed in a specific lateral direction under the influence of the antiferromagnetic layer 55. Here, the free ferromagnetic layer 52 may have a layered structure including a NiFe layer 52a overlaid on the basement layer 51 and a CoFe layer 52b overlaid on the NiFe layer 52a, for example. The intermediate conductive layer 53 may be made of Cu, for example. The pinned ferromagnetic layer 54 may be made of a ferromagnetic material such as CoFe, for example. The antiferromagnetic layer 55 may be made of an antiferromagnetic alloy material such as IrMn, PdPtMn, or the like. The conductive protection layer 56 may be made of Au, Pt, or the like.

Alternatively, a so-called tunnel-junction film may be utilized in the magnetoresistive film 43. The tunnel-junction film includes an intermediate insulation layer between the free and pinned ferromagnetic layers 52, 54 in place of the aforementioned intermediate conductive layer 53. The intermediate insulation layer may be made of $Al_2O_3$, for example.

When the CPP structure MR read element 32 is opposed to the surface of the magnetic recording disk 13 for reading a magnetic information data, the magnetization of the free ferromagnetic layer 52 is allowed to rotate in the magnetoresistive film 43 in response to the inversion of the magnetic polarity applied from the magnetic recording disk 13. The rotation of the magnetization in the free ferromagnetic layer 52 induces variation in the electric resistance of the magnetoresistive film 43. When a sensing current is supplied to the magnetoresistive film 43 through the upper electrode layer 46 and the lower electrode 38, a variation in the level of any parameter such as voltage appears, in response to the variation in the magnetoresistance, in the sensing current output from the upper electrode layer 46 and the lower electrode 38. The variation in the level can be utilized to detect a magnetic bit data recorded on the magnetic recording disk 13.

Figure 5:
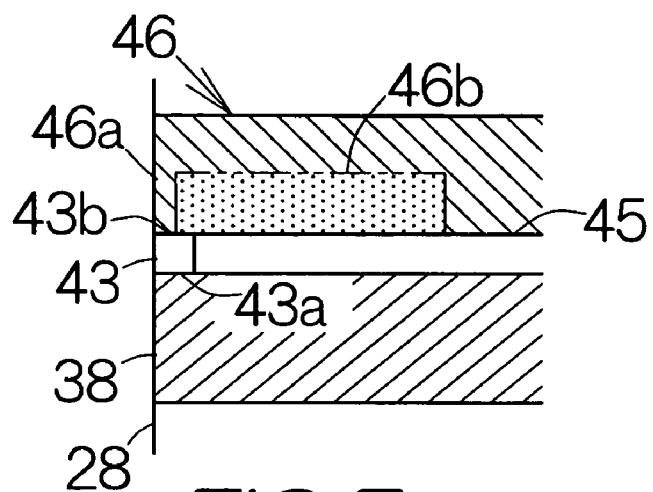
FIG. 5 is an enlarged partial sectional view taken along the line 5-5 in FIG. 3.
Figure 6:
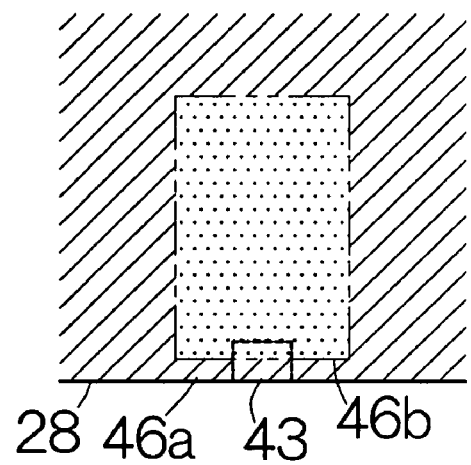
FIG. 6 is an enlarged partial sectional view taken along the line 6-6 in FIG. 3, corresponding to an enlarged plan view of the upper electrode layer.

Here, the upper electrode layer 46 will be described in detail referring to FIG. 5. The upper electrode layer 46 includes a low resistance region 46a extending rearward along the upper boundary 43b of the magnetoresistive film 43 from the front end exposed at the air bearing surface 28. A high resistance region 46b extends rearward from the rear end of the low resistance region 46a on the upper boundary 43b. The high resistance region 46b has a resistivity higher than that of the low resistance region 46a. The low resistance region 46a may extend rearward over the high resistance region 46b, as is apparent from FIG. 5. Moreover, the low resistance region 46a may extend rearward around the high resistance region 46b along the surface of the overlaid insulation layer 45, as is apparent from FIG. 6. The rear end of the low resistance region 46a is connected to a terminal pad, not shown.

The upper electrode layer 46 may be made of an electrically-conductive soft magnetic material such as a NiFe, for example. If the upper electrode layer 46 may have not only a property of electric conductors but also a soft magnetic property, the upper electrode layer 46 is also allowed to serve as an upper shielding layer for the CPP structure MR read element 32. The gap or distance between the lower shielding layer or electrode 38 and the upper electrode layer 46 serves to determine the resolution of the magnetic recordation in the direction of a magnetic track on the magnetic recording disk 13.

The high resistance region 46b maybe formed based on oxygen atoms added into the upper electrode layer 46. Introduction of oxygen gas, irradiation of oxygen plasma, or the like, may be employed to add the oxygen atoms into the upper electrode layer 46. Alternatively, the high resistance region 46b may be formed based on ions added into the upper electrode layer 46. Ion implantation or the like may be employed to add the ions into the upper electrode layer 46. Otherwise, the low and high resistance regions 46a, 46b may be established based on the size of crystal grains included in the upper electrode layer 46. In this case, the low resistance region 46a may include crystal grains having a grain size larger than that of crystal grains in the high resistance region 46b. The smaller the size of the grains gets, the higher the electric resistance gets. Irradiation of a laser beam on crystal grains helps crystal grains grow larger in size.

A sensing current is exchanged between the low resistance region 46a of the upper electrode layer 46 and the lower electrode 38 through the magnetoresistive film 43 in the CPP structure MR read element 32. The high resistance region 46b serves to restrict the path of the sensing current nearest to the air bearing surface 28, as is apparent from FIGS. 5 and 6. The sensing current is allowed to concentrate at a position closest to the air bearing surface 28 in the magnetoresistive film 43.

If the recording density will further be improved in the magnetic recording disk 13, the magnetic field leaking from the magnetic recording disk 13 is expected to get reduced. Although a magnetic field of a smaller intensity may maintain a sufficient rotation of the magnetization in the magnetoresistive film 43 near the air bearing surface 28, a magnetic field of a smaller intensity remarkably reduces the rotation of the magnetization in the magnetoresistive film 43 at a position remoter from the air bearing surface 28. The CPP structure MR read element 32 allows the sensing current to concentrate at a position closest to the air bearing surface 28. The sensing current is thus allowed to pass through a portion where the magnetization sufficiently rotates. The CPP structure MR read element 32 in this manner maintains a sufficient variation in the electric resistance. A reduced sensitivity can be prevented in the CPP structure MR read element 32.

Figure 7:
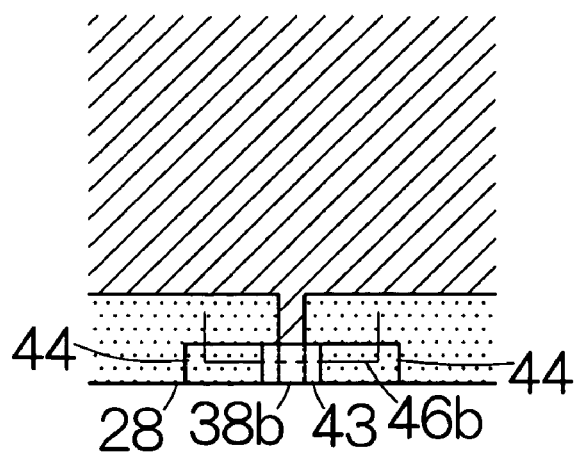
FIG. 7 is an enlarged plane view of a lower electrode, corresponding to FIG. 6.

Moreover, the terminal piece of the lower electrode 38 serves to concentrate the sensing current at the centerline of a recording track, as shown in FIG. 7. The sensing current is allowed to pass through the magnetoresistive film 43 along the centerline of a recording track. The path of the sensing current can be reduced in area. A further improvement is expected in the sensitivity. If the lower electrode 38 contacts the overall lower boundary 43a of the magnetoresistive film 43, the sensing current is expected to concentrate at the boundary between the magnetoresistive film 43 and the magnetic domain control layers 44.

Figure 8:
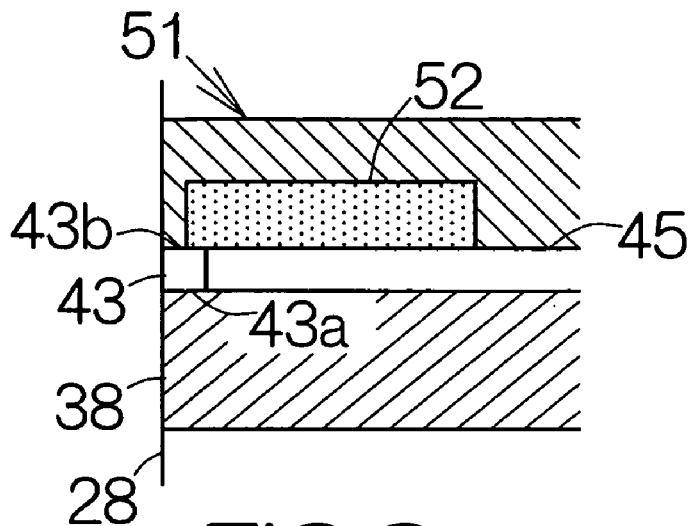
FIG. 8 is an enlarged partial sectional view schematically illustrating a portion of a CPP structure MR read element according to another embodiment, corresponding to FIG. 5.

As shown in FIG. 8, the aforementioned upper electrode layer 46 may be replaced with an upper electrode 51 allowing the front end to contact the upper boundary 43b of the magnetoresistive film 43, and a high resistance layer 52 extending rearward along the upper boundary 43b of the magnetoresistive film 43 from the front end retreating from the air bearing surface 28. The front end of the upper electrode 51 is exposed at the air bearing surface 28. The high resistance layer 52 has a resistivity at least higher than that of the upper electrode 51. Here, the high resistance layer 52 is interposed between the upper electrode 51 and the magnetoresistive film 43 as well as between the upper electrode 51 and the overlaid insulation layer 45.

The upper electrode 51 may be made of a soft magnetic electric conductor such as NiFe in the same manner as the aforementioned upper electrode layer 46. The high resistance layer 52 may be made of an insulating material such as $Al_2O_3$, for example. In particular, the high resistance layer 52 is preferably made of a soft magnetic insulator such as a soft ferrite, an amorphous magnetic material, or the like. If the high resistance layer 52 has not only a property of electric insulators but also a soft magnetic property, the high resistance layer 52 is also allowed to serve as an upper shielding layer for the CPP structure MR read element 32 along with the upper electrode 51.

The high resistance layer 52 serves to restrict the path of the sensing current nearest to the air bearing surface 28 in the upper electrode 51, in the same manner as described above. The sensing current is allowed to concentrate at a position closest to the air bearing surface 28 in the magnetoresistive film 43. The CPP structure MR read element 32 in this manner maintains a sufficient variation in the electric resistance. A reduced sensitivity can be prevented in the CPP structure MR read element 32.

Figure 9:
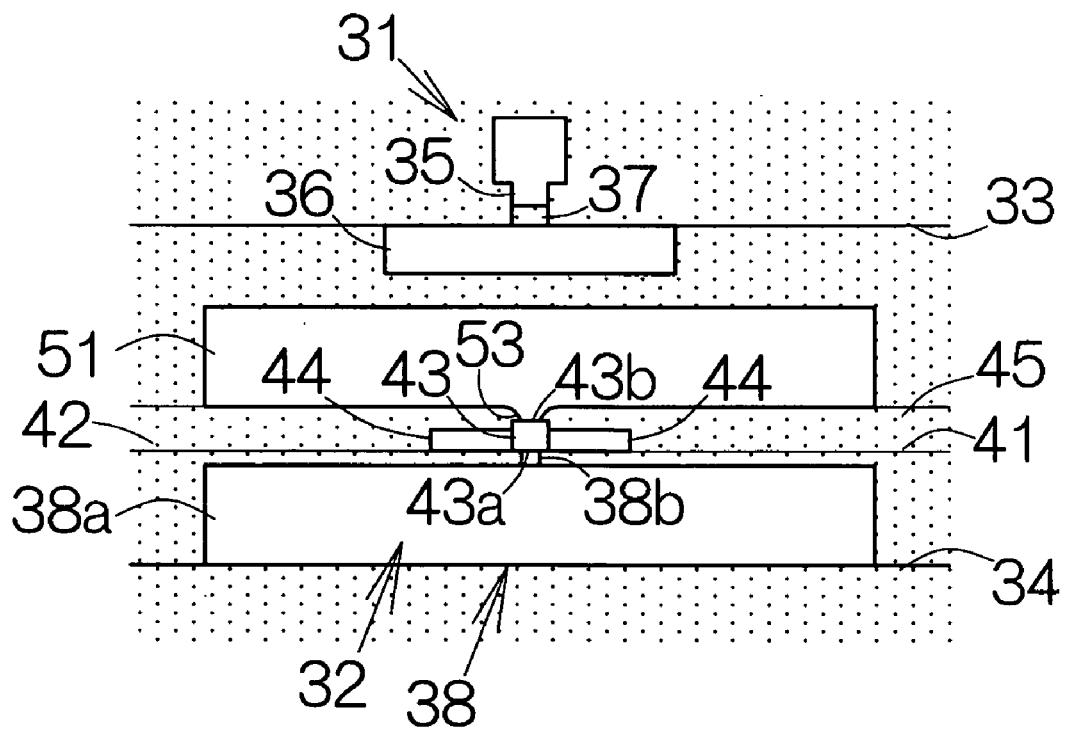
FIG. 9 is a front view schematically illustrating a portion of a CPP structure MR read element according to a modification, corresponding to FIG. 3.

As shown in FIG. 9, a protrusion 53 may be formed on the upper electrode 51 so as to protrude from the lower surface of the upper electrode 51 at the front end of the upper electrode 51, for example. The protrusion 53 serves to reduce the contact area between the upper electrode 51 and the upper boundary 43b of the magnetoresistive film 43 in the lateral direction of a recording track. The protrusion 53 cooperates with the terminal piece 38b in reducing the path of the sensing current along the centerline of a recording track. A further improved sensitivity is expected.

Figure 10:
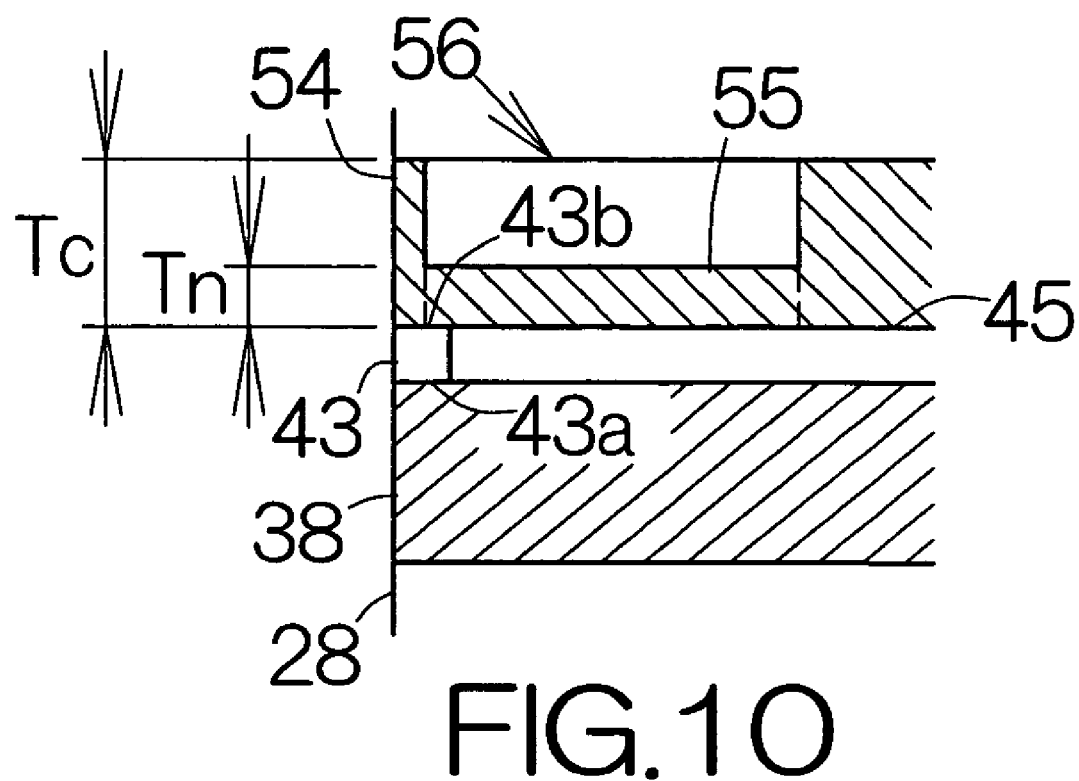
FIG. 10 is an enlarged partial sectional view schematically illustrating a portion of a CPP structure MR read element according to a further embodiment, corresponding to FIG. 5.

As shown in FIG. 10, the upper electrode layer 46 may be replaced with an upper electrode layer 56 including a low resistance region 54 extending along the upper boundary 43b of the magnetoresistive film 43 and a high resistance region likewise extending along the upper boundary 43b of the magnetoresistive film 43, for example. In this case, the low resistance region 54 has a first thickness Tc while the high resistance region 55 has a second thickness Tn smaller than the first thickness Tc. The electric resistance depends upon the thickness of the upper electrode layer 56. The high resistance region 55 serves to restrict the path of the sensing current nearest to the air bearing surface 28 in the upper electrode layer 56, in the same manner as described above. The sensing current is allowed to concentrate at a position closest to the air bearing surface 28 in the magnetoresistive film 43. The CPP structure MR read element 32 in this manner maintains a sufficient variation in the electric resistance. A reduced sensitivity can be prevented in the CPP structure MR read element 32.

What is claimed is:

1. A current-perpendicular-to-the-plane structure magnetoresistive element comprising:

a magnetoresistive film defining a front end at a medium-opposed surface of a head slider, said magnetoresistive film extending rearward from the front end along a predetermined datum plane intersecting the medium-opposed surface of the head slider; and an electrode layer extending rearward along a boundary of the magnetoresistive film from a front end exposed at the medium-opposed surface of the head slider, wherein said electrode layer includes:

a low resistance region extending rearward along the boundary from a front end exposed at the medium-opposed surface of the head slider; and a high resistance region extending rearward along the boundary from the rear end of the low resistance region, said high resistance region having a resistivity higher than that of the low resistance region.

2. The current-perpendicular-to-the-plane structure magnetoresistive element according to claim 1, wherein said high resistance region is formed based on oxygen atoms added into the electrode layer.

3. The current-perpendicular-to-the-plane structure magnetoresistive element according to claim 1, wherein said high resistance region is formed based on ions added into the electrode layer.

4. The current-perpendicular-to-the-plane structure magnetoresistive element according to claim 1, wherein said low resistance region includes crystal grains having a grain size larger than that of crystal grains in the high resistance region.

5. The current-perpendicular-to-the-plane structure magnetoresistive element according to claim 1, wherein said electrode layer includes:

a first region extending along the boundary so as to form the lower resistance region, said first region having a first thickness; and a second region extending along the boundary so as to form the high resistance region, said second region having a second thickness smaller than the first thickness.

6. A current-perpendicular-to-the-plane structure magnetoresistive element comprising:

a magnetoresistive film defining a front end at a medium-opposed surface of a head slider, said magnetoresistive film extending rearward from the front end along a predetermined datum plane intersecting the medium-opposed surface of the head slider;

an upper electrode layer extending rearward along an upper boundary of the magnetoresistive film from a front end exposed at the medium-opposed surface of the head slider; and a lower electrode allowing at least a tip end to contact a lower boundary of the magnetoresistive film, said tip end exposed at the medium-opposed surface of the head slider, wherein said upper electrode layer includes:

a low resistance region extending rearward along the upper boundary from a front end exposed at the medium-opposed surface of the head slider; and a high resistance region extending rearward along the upper boundary from the rear end of the low resistance region, said high resistance region having a resistivity higher than that of the low resistance region.

7. A current-perpendicular-to-the-plane structure magnetoresistive element comprising:

a magnetoresistive film defining a front end at a medium-opposed surface of a head slider, said magnetoresistive film extending reanvard from the front end along a predetermined datum plane intersecting the medium-opposed surface of the head slider;

an electrode allowing a tip end to contact a boundary of the magnetoresistive film, said tip end exposed at the medium-opposed surface; and a high resistance layer embedded in the electrode and extending rearward along the boundary from a tip end retreating from the medium-opposed surface, said high resistance layer having a resistivity higher than that of the electrode.

8. A current-perpendicular-to-the-plane structure magnetoresistive element comprising:

a magnetoresistive film defining a front end at a medium-opposed surface of a head slider, said magnetoresistive film extending rearward from the front end along a predetermined datum plane intersecting the medium-opposed surface of the head slider;

an upper electrode allowing a tip end to contact an upper boundary of the magnetoresistive element, said tip end exposed at the medium-opposed surface of the head slider;

a high resistance layer embedded in the upper electrode and extending rearward along the upper boundary from a tip end retreating from the medium-opposed surface, said high resistance layer having a resistivity higher at least than that of the upper electrode; and a lower electrode allowing at least a tip end to contact a lower boundary of the magnetoresistive film, said tip end exposed at the medium-opposed surface of the head slider.

9. The current-perpendicular-to-the-plane structure magnetoresistive element according to claim 7, wherein the electrode extends rearward around the high resistance layer along the predetermined datum plane.

10. The current-perpendicular-to-the-plane structure magnetoresistive element according to claim 8, wherein the upper electrode extends rearward around the high resistance layer along the predetermined datum plane.

* * * * *

UNITED STATES PATENT AND TRADEMARK OFFICE
CERTIFICATE OF CORRECTION

PATENT NO. : 7,312,957 B2  Page 1 of 1
APPLICATION NO. : 10/940941
DATED : December 25, 2007
INVENTOR(S) : Oshima et al.

It is certified that error appears in the above-identified patent and that said Letters Patent is hereby corrected as shown below:

Col. 11, line 32, delete "reanvard" and insert --rearward--.

Signed and Sealed this

Tenth Day of June, 2008

JON W. DUDAS
*Director of the United States Patent and Trademark Office*